(12) United States Patent
Ishiguro et al.

(10) Patent No.: US 8,012,806 B2
(45) Date of Patent: Sep. 6, 2011

(54) MULTI-DIRECTIONAL TRENCHING OF A DIE IN MANUFACTURING SUPERJUNCTION DEVICES

(75) Inventors: Takeshi Ishiguro, Fukushima-ken (JP); Kenji Sugiura, Kawasaki (JP); Hugh J. Griffin, Newtownabbey (GB)

(73) Assignee: Icemos Technology Ltd., Belfast, Northern Ireland (GB)

( * ) Notice: Subject to any disclaimer, the term of this patent is extended or adjusted under 35 U.S.C. 154(b) by 522 days.

(21) Appl. No.: 12/031,895

(22) Filed: Feb. 15, 2008

(65) Prior Publication Data

US 2009/0085147 A1   Apr. 2, 2009

Related U.S. Application Data

(60) Provisional application No. 60/975,878, filed on Sep. 28, 2007.

(51) Int. Cl.
*H01L 21/44* (2006.01)
*H01L 21/48* (2006.01)
*H01L 21/50* (2006.01)
*H01L 21/46* (2006.01)
*H01L 21/78* (2006.01)

(52) U.S. Cl. ........................ 438/113; 438/460
(58) Field of Classification Search .......... 438/106–132, 438/460–465, E21.545
See application file for complete search history.

(56) References Cited

U.S. PATENT DOCUMENTS

| | | | |
|---|---|---|---|
| 3,404,295 A | 10/1968 | Warner, Jr. | |
| 3,497,777 A | 2/1970 | Teszner | |
| 3,564,356 A | 2/1971 | Wilson | |
| 4,158,206 A | 6/1979 | Neilson | |
| 4,211,582 A | 7/1980 | Horng et al. | |
| 4,238,278 A | 12/1980 | Antipov | |
| 4,491,486 A | 1/1985 | Iwai | |
| 4,754,310 A | 6/1988 | Coe | |
| 4,775,881 A | 10/1988 | Ploog et al. | |
| 4,821,095 A | 4/1989 | Temple | |
| 4,866,004 A | 9/1989 | Fukushima | |
| 4,868,624 A | 9/1989 | Grung et al. | |
| 4,895,810 A | 1/1990 | Meyer et al. | |
| 4,994,406 A | 2/1991 | Vasquez et al. | |
| 5,019,522 A | 5/1991 | Meyer et al. | |
| 5,027,180 A | 6/1991 | Nishizawa et al. | |
| 5,045,903 A | 9/1991 | Meyer et al. | |
| 5,105,243 A | 4/1992 | Nakagawa et al. | |

(Continued)

FOREIGN PATENT DOCUMENTS

JP          52-038889 A         3/1977

(Continued)

OTHER PUBLICATIONS

Chenming Hu; Optimum Doping Profile for minimum Ohmic Resistance and High-Breakdown Voltage; IEEE Transactions on Electron Devices, vol. ED-26, No. 3, pp. 243-244; Mar. 1979.

(Continued)

*Primary Examiner* — Cuong Q Nguyen

(74) *Attorney, Agent, or Firm* — Panitch Schwarze Belisario & Nadel LLP

(57) ABSTRACT

A method of manufacturing a superjunction device includes providing a semiconductor wafer having at least one die. At least one first trench having a first orientation is formed in the at least one die. At least one second trench having a second orientation that is different from the first orientation is formed in the at least one die.

15 Claims, 6 Drawing Sheets

U.S. PATENT DOCUMENTS

| | | | |
|---|---|---|---|
| 5,216,275 A | 6/1993 | Chen |
| 5,218,226 A | 6/1993 | Slatter et al. |
| 5,219,777 A | 6/1993 | Kang |
| 5,366,914 A | 11/1994 | Takahashi et al. |
| 5,389,815 A | 2/1995 | Takahashi |
| 5,395,790 A | 3/1995 | Lur |
| 5,418,376 A | 5/1995 | Muraoka et al. |
| 5,430,311 A | 7/1995 | Murakami et al. |
| 5,432,113 A | 7/1995 | Tani |
| 5,435,888 A | 7/1995 | Kalnitsky et al. |
| 5,438,215 A | 8/1995 | Tihanyi |
| 5,472,888 A | 12/1995 | Kinzer |
| 5,506,421 A | 4/1996 | Palmour |
| 5,510,287 A | 4/1996 | Chen et al. |
| 5,519,245 A | 5/1996 | Tokura et al. |
| 5,572,048 A | 11/1996 | Sugawara |
| 5,598,018 A | 1/1997 | Lidow et al. |
| 5,726,469 A | 3/1998 | Chen |
| 5,742,087 A | 4/1998 | Lidow et al. |
| 5,744,994 A | 4/1998 | Williams |
| 5,786,619 A | 7/1998 | Kinzer |
| 5,902,127 A | 5/1999 | Park |
| 5,926,713 A | 7/1999 | Hause et al. |
| 5,929,690 A | 7/1999 | Williams |
| 5,939,754 A | 8/1999 | Hoshi |
| 5,998,292 A | 12/1999 | Black et al. |
| 6,008,106 A | 12/1999 | Tu et al. |
| 6,011,298 A | 1/2000 | Blanchard |
| 6,066,878 A | 5/2000 | Neilson |
| 6,081,009 A | 6/2000 | Neilson |
| 6,174,773 B1 | 1/2001 | Fujishima |
| 6,184,555 B1 | 2/2001 | Tihanyi et al. |
| 6,190,970 B1 | 2/2001 | Liao et al. |
| 6,198,127 B1 | 3/2001 | Kocon |
| 6,214,698 B1 | 4/2001 | Liaw et al. |
| 6,222,229 B1 | 4/2001 | Hebert et al. |
| 6,239,463 B1 | 5/2001 | Williams et al. |
| 6,265,281 B1 | 7/2001 | Reinberg |
| 6,291,856 B1 | 9/2001 | Miyasaka et al. |
| 6,300,171 B1 | 10/2001 | Frisina |
| 6,307,246 B1 | 10/2001 | Nitta et al. |
| 6,310,365 B1 | 10/2001 | Chen |
| 6,359,309 B1 | 3/2002 | Liao et al. |
| 6,362,505 B1 | 3/2002 | Tihanyi |
| 6,391,723 B1 | 5/2002 | Frisina |
| 6,410,958 B1 | 6/2002 | Usui et al. |
| 6,426,991 B1 | 7/2002 | Mattson et al. |
| 6,452,230 B1 | 9/2002 | Boden, Jr. |
| 6,459,124 B1 | 10/2002 | Zhang et al. |
| 6,465,325 B2 | 10/2002 | Ridley et al. |
| 6,495,421 B2 | 12/2002 | Luo |
| 6,501,130 B2 | 12/2002 | Disney |
| 6,501,146 B1 | 12/2002 | Harada |
| 6,504,230 B2 | 1/2003 | Deboy et al. |
| 6,509,220 B2 | 1/2003 | Disney |
| 6,512,267 B2 | 1/2003 | Kinzer et al. |
| 6,534,367 B2 | 3/2003 | Peake et al. |
| 6,566,201 B1 | 5/2003 | Blanchard |
| 6,613,644 B2 | 9/2003 | Lachner |
| 6,624,494 B2 | 9/2003 | Blanchard et al. |
| 6,635,906 B1 | 10/2003 | Chen |
| 6,686,244 B2 | 2/2004 | Blanchard |
| 6,710,400 B2 | 3/2004 | Blanchard |
| 6,710,403 B2 | 3/2004 | Sapp |
| 6,710,418 B1 | 3/2004 | Sapp |
| 6,713,813 B2 | 3/2004 | Marchant |
| 6,762,473 B1 | 7/2004 | Goushcha et al. |
| 6,787,872 B2 | 9/2004 | Kinzer |
| 6,797,589 B2 | 9/2004 | Adams et al. |
| 6,936,867 B2 | 8/2005 | Chen |
| 6,936,907 B2 | 8/2005 | Chen |
| 6,998,681 B2 | 2/2006 | Chen |
| 7,015,104 B1 | 3/2006 | Blanchard |
| 7,023,069 B2 | 4/2006 | Blanchard |
| 7,041,560 B2 | 5/2006 | Hshieh |
| 7,052,982 B2 | 5/2006 | Hshieh et al. |
| 7,109,110 B2 | 9/2006 | Hsieh |
| 2002/0070418 A1 | 6/2002 | Kinzer et al. |
| 2003/0222327 A1 | 12/2003 | Yamaguchi |
| 2005/0176192 A1 | 8/2005 | Hsieh |
| 2006/0214221 A1 | 9/2006 | Challa |
| 2010/0015797 A1 | 1/2010 | Saito et al. |

FOREIGN PATENT DOCUMENTS

| | | |
|---|---|---|
| WO | 03005416 A2 | 1/2003 |
| WO | 2005001941 A3 | 1/2005 |
| WO | 2005031880 A1 | 4/2005 |
| WO | 2007023950 A1 | 3/2007 |

OTHER PUBLICATIONS

P. Rossel; Power M.O.S. Devices; Microelectron, Reliab., vol. 24, No. 2, pp. 339-366; 1984.

Victor A.K. Temple et al.; A 600-Volt MOSFET Designed for Low On-Resistance; IEEE Transactions on Electron Devices, vol. ED-27, No. 2, pp. 343-349; Feb. 1980.

Xing-Bi Chen et al.; Optimum Doping Profile of Power MOSFET; IEEE Transactions on Electron Devices, vol. ED-29, No. 6, pp. 985-987; Jun. 1982.

U.S. Appl. No. 11/962,530, Takeshi Ishiguro.
U.S. Appl. No. 12/031,909, Takeshi Ishiguro.
U.S. Appl. No. 12/029,857, Takeshi Ishiguro.
U.S. Appl. No. 11/962,523, Takeshi Ishiguro.
Office Action dated Jun. 23, 2010 issued by the U.S. Patent Office in counterpart U.S. Appl. No. 12/031,909.

MULTI-DIRECTIONAL TRENCHING OF A DIE IN MANUFACTURING SUPERJUNCTION DEVICES

CROSS REFERENCE TO RELATED APPLICATIONS

This Application claims priority to U.S. Provisional Patent Application No. 60/975,878, filed on Sep. 28, 2007, entitled "Multi-Directional Trenching in Manufacturing Superjunction Devices."

BACKGROUND OF THE INVENTION

An embodiment of the present invention relates generally to a method of manufacturing a semiconductor device, and more particularly, to a method of manufacturing a superjunction device with a first plurality of trenches having one orientation and a second plurality of trenches having a second orientation different than the first orientation.

Semiconductor wafer manufacture generally refers to the process of making integrated circuits on silicon wafers. A typical semiconductor wafer is generally circular in plan view. Individual electronic circuits or devices are formed across at least one surface of the wafer and then the wafer is typically cut (sawed or diced) into a plurality of individual "dies" for packaging into individual integrated circuits (ICs).

Since the invention of superjunction devices by Dr. Xingbi Chen, as disclosed in U.S. Pat. No. 5,216,275, the contents of which are incorporated by reference herein, there have been many attempts to expand and improve on the superjunction effect of his invention. U.S. Pat. Nos. 6,410,958, 6,300,171 and 6,307,246 are examples of such efforts and are incorporated herein by reference.

Trench type superjunction devices are expected to replace multi-epi superjunction devices because of the potential lower processing cost. FIG. 1A illustrates a top plan view of a wafer 10 used in the manufacturing of a plurality of trench-type superjunction devices or dies 20. FIG. 1B shows a magnified view of two dies 20 representative of the plurality of dies 20 located on the wafer 10. Each die 20 includes a plurality of trenches 22, each of the trenches 22 traversing the die 20 in a generally horizontal orientation. FIG. 1C shows an alternate configuration wherein the plurality of trenches 22 are each oriented generally vertically on the die 20. In each case, all of the trenches 22 on all of the dies 20 of the wafer 10 have the same orientation. FIG. 1D illustrates an enlarged partial cross-sectional view of a die 20 having a plurality of trenches 22 formed in a silicon layer 12 disposed on a substrate 11. A plurality of corresponding mesas 24 are thereby formed, each mesa 24 being capped by a layer of oxide 26. The trenches 22 are typically filled with a refill material 28.

Generally, the cost of semiconductor device manufacturing has been reduced by condensing the design rules (recommended parameters) and enlarging the diameter of the process wafer. The design rules reduction may be applied to trench-type superjunction technology, as described in co-pending U.S. patent application Ser. No. 11/962,530. However, conventional trenching methods tend to cause wafer bowing and warping. Such deformations are especially prevalent when trenching large diameter wafers (e.g., greater than about six inches). Once bowing and warping occurs, a wafer typically can no longer be processed effectively, if at all. Further, even if the wafer remains capable of processing, there is a higher risk of chipping or breakage. The degree of bowing and/or warping is greater when using deep trenching, such as the type of deep trenching used, for example, in the formation of superjunction devices. Thus, the use of conventional trenching methods for manufacturing superjunction devices does not permit the cost reduction achieved by increasing the diameter of the wafer.

It is desirable to provide a method of manufacturing trench-type superjunction devices that minimizes and/or eliminates the effects of bowing and warping. It is further desirable to provide a method of manufacturing trench-type superjunction devices that reduces manufacturing costs by enabling the use of larger wafer diameters.

BRIEF SUMMARY OF THE INVENTION

Briefly stated, embodiments of the present invention comprise a method of manufacturing a superjunction device. One embodiment of the method includes providing a semiconductor wafer having at least one die. The method further includes forming at least one first trench in the at least one die, the at least one first trench having a first orientation. The method also includes forming at least one second trench in the at least one die, the at least one second trench having a second orientation that is different from the first orientation. In preferred embodiments, at least one additional trench is formed in the at least one die, each additional trench having an orientation that is different from at least one of the first orientation and the second orientation.

Another embodiment of the present invention comprises a method of manufacturing a superjunction device. The method includes providing a semiconductor wafer having at least one die. The method further includes forming a first plurality of trenches in the at least one die, each of the first plurality of trenches having a first orientation. The method also includes forming a second plurality of trenches in the at least one die, each of the second plurality of trenches having a second orientation that is different from the first orientation.

Embodiments of the present invention also comprise superjunction devices. In one embodiment, the superjunction device includes a semiconductor wafer having at least one die. At least one first trench is formed in the at least one die, the at least one first trench having a first orientation. At least one second trench is formed in the at least one die, the at least one second trench having a second orientation that is different from the first orientation.

Yet another embodiment of the present invention comprises other types of semiconductor devices formed on or in a semiconductor wafer. The semiconductor wafer includes at least one die. At least one first trench is formed in the at least one die, the at least one first trench having a first orientation. At least one second trench is formed in the at least one die, the at least one second trench having a second orientation that is different from the first orientation.

BRIEF DESCRIPTION OF THE DRAWINGS

The foregoing summary, as well as the following detailed description of preferred embodiments of the invention, will be better understood when read in conjunction with the appended drawings. For the purpose of illustration, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1A:
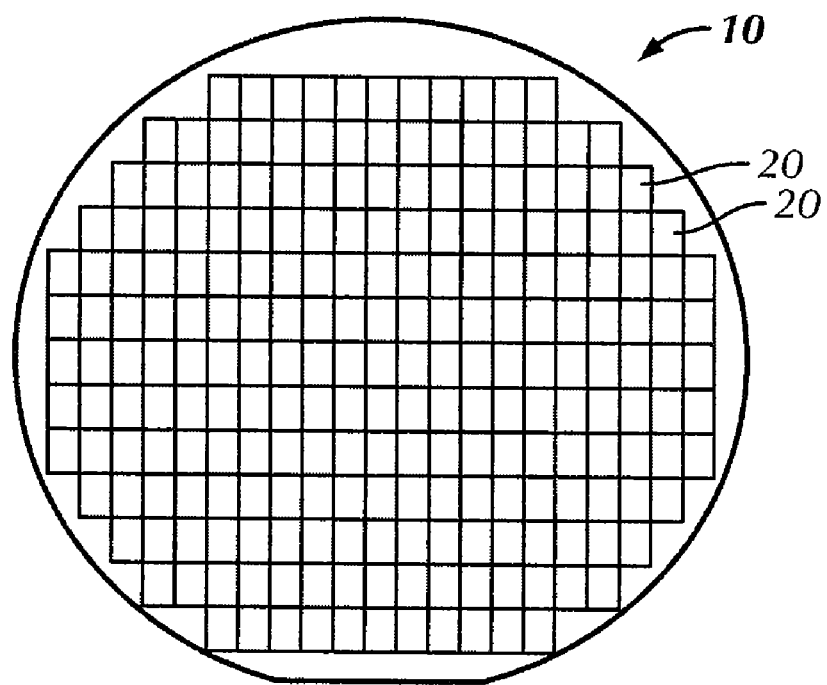
FIG. 1A is a top plan view of a prior art semiconductor wafer having a plurality of dies formed thereon.
Figure 1B:
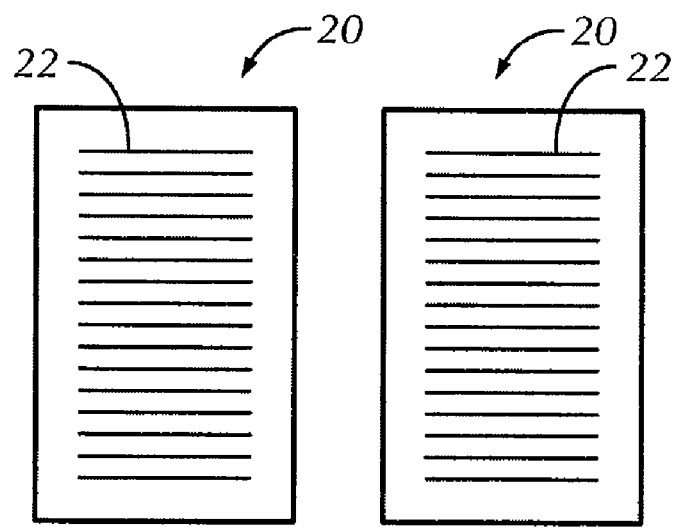
FIG. 1B is a greatly enlarged top plan view of two adjacent dies from the prior art wafer of FIG. 1A.
Figure 1C:
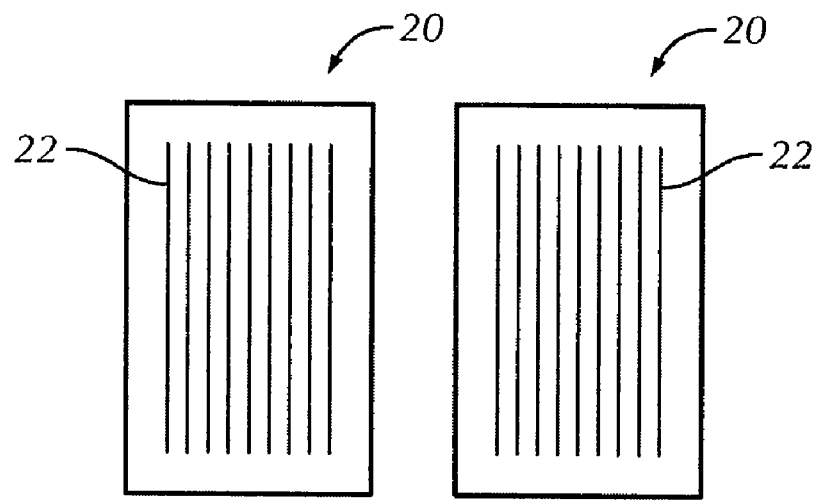
FIG. 1C is a greatly enlarged top plan view of two alternate adjacent dies from the prior art wafer of FIG. 1A.
Figure 1D:
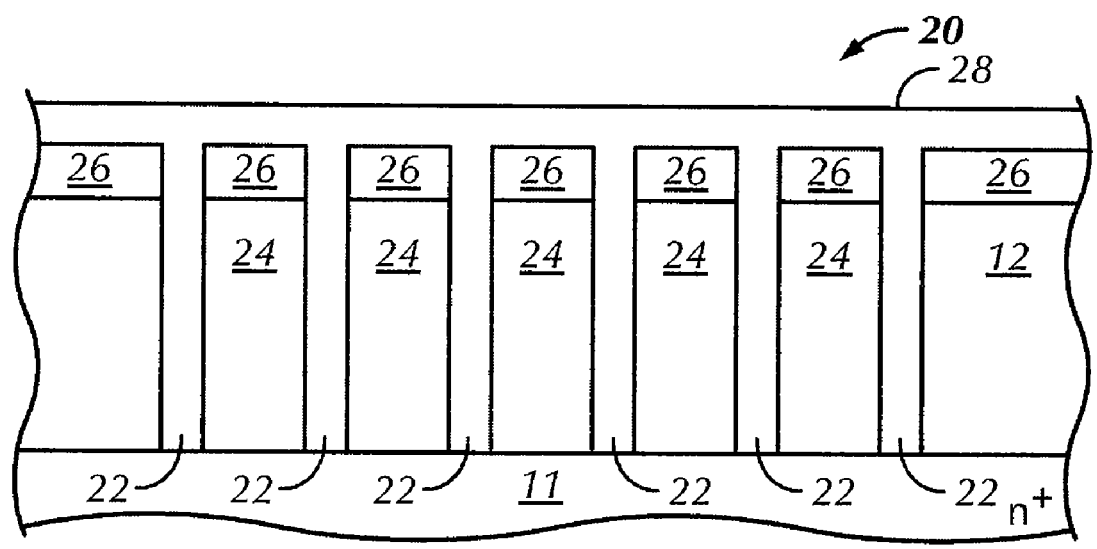
FIG. 1D is an enlarged partial cross-sectional elevational view of one of the dies from either of FIGS. 1B or 1C.

Certain terminology is used in the following description for convenience only and is not limiting. The words "right", "left", "lower", and "upper" designate directions in the drawings to which reference is made. The words "inwardly" and "outwardly" refer to directions toward and away from, respectively, the geometric center of the device and designated parts thereof. The terminology includes the above-listed words, derivatives thereof, and words of similar import. Additionally, the words "a" and "an", as used in the claims and in the corresponding portions of the specification, mean "at least one."

As used herein, reference to conductivity will be limited to the embodiment described. However, those skilled in the art know that p-type conductivity can be switched with n-type conductivity and the device would still be functionally correct (i.e., a first or a second conductivity type). Therefore, where used herein, reference to n or p can also mean either n or p or p and n can be substituted therefor.

Furthermore, $n^+$ and $p^+$ refer to heavily doped n and p regions, respectively; $n^{++}$ and $p^{++}$ refer to very heavily doped n and p regions, respectively; $n^-$ and $p^-$ refer to lightly doped n and p regions, respectively; and $n^{--}$ and $p^{--}$ refer to very lightly doped n and p regions, respectively. However, such relative doping terms should not be construed as limiting.

Figure 2A:
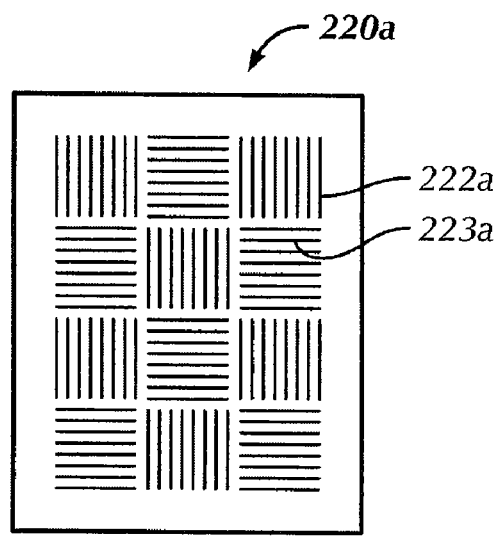
FIGS. 2A-2C are greatly enlarged top plan views of dies manufactured in accordance with preferred embodiments of the present invention.

Referring to the drawings in detail, wherein like reference numerals indicate like elements throughout, there is shown in FIG. 2A a top plan view of an individual die 220a manufactured in accordance with a preferred embodiment of the present invention. A plurality of trenches 222a are formed on the die 220a, the trenches 222a having a first orientation, depicted in FIG. 2A as being vertical. A further plurality of trenches 223a are also formed on the die 220a, the trenches 223a having a second orientation, depicted in FIG. 2A as being horizontal. In the embodiment depicted in FIG. 2A, the first and second trench orientations differ by approximately 90°, but the trenches 222a, 223a may be formed at other angles relative to one another, such as, for example, 45°. By utilizing more than one trench direction within the die 220a, stress is reduced on the die 220a and the overall wafer.

Embodiments of the present invention are not limited to the example illustrated in FIG. 2A. There is no restriction on orientations, angles, lengths, widths, and/or shapes of trenches 222a, 223a. There is also no restriction on the number of trenches 222a, 223a or combinations available on the die 220a.

Figure 2B:
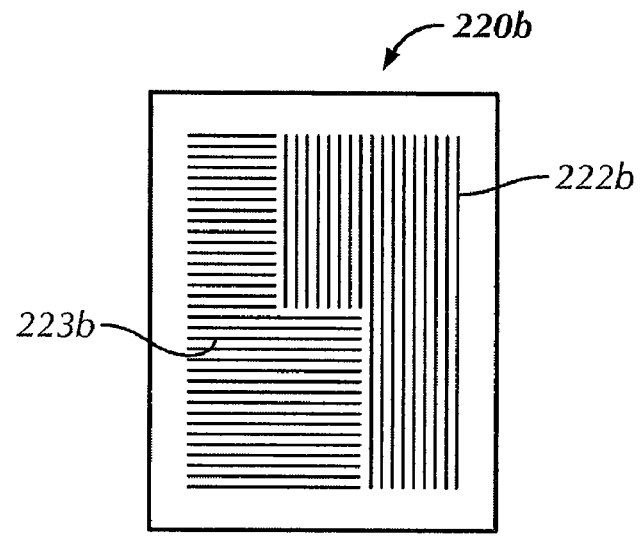

In preferred embodiments, an area occupied by trenches 222a of one orientation should be generally equal in size to an area occupied by trenches 223a of another orientation. Preferably, the trenches 222a, 223a are located on the die 220a generally symmetrically. The configurations of the trenches 222a, 223a reduce the mechanical stress placed on the die 220a and overall wafer to thereby reduce bowing or warping of the wafer. FIG. 2B illustrates a second embodiment of a die 220b, including vertical trenches 222b and horizontal trenches 223b. Die 220b maintains about a 1:1 area ratio (as described above) of trenches 222b, 223b despite the irregular configuration.

Figure 2C:
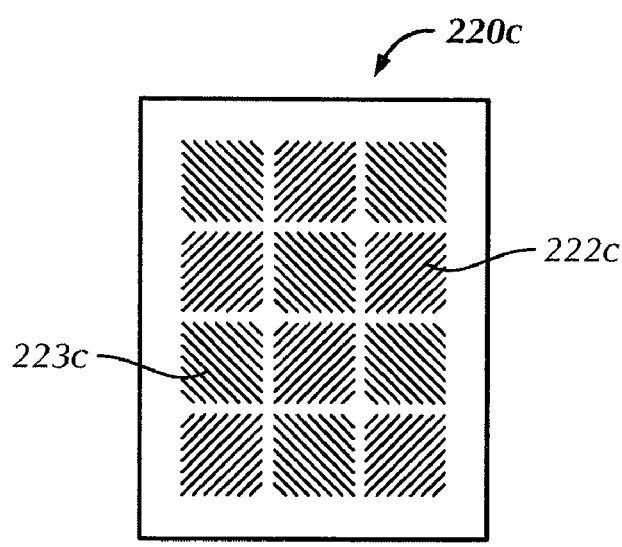

FIG. 2C illustrates a further embodiment of a die 220c, which features a different type of trenching pattern. The die 220c includes a plurality of trenches 222c that are angled at about 45° from the horizontal direction and a plurality of trenches 223c that are angled at about 135° from the horizontal direction. The trenches 222c, 223c are grouped with similarly oriented trenches to form square patterns on the die 220c. FIG. 2C thus illustrates an example where the die 220c may include trenches 222c, 223c of various lengths while continuing to maintain about a 1:1 area ratio convenient for minimizing stress on the wafer.

Figure 3A:
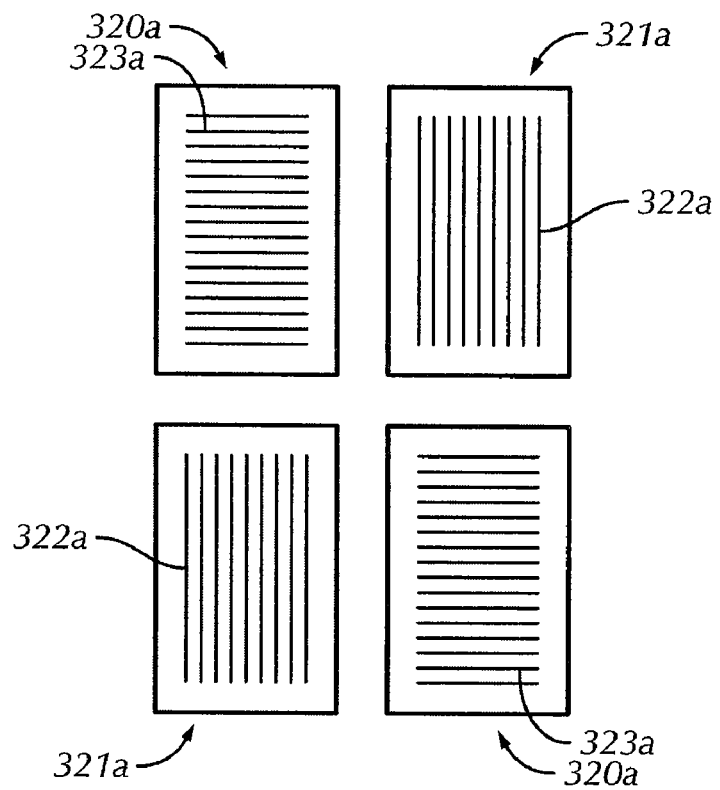
FIGS. 3A and 3B are greatly enlarged top plan views of adjacent dies on a wafer manufactured in accordance with preferred embodiments of the present invention.

FIG. 3A illustrates an alternative embodiment of the present invention. The dies 320a, 321a shown are formed adjacent to one another on a wafer, such as the wafer 10 shown in FIG. 1A. In each die 320a are formed a plurality of trenches 323a oriented in a horizontal direction. In each die 321a are formed a plurality of trenches 322a oriented in a vertical direction. Unlike in the previous embodiments of FIGS. 2A-2C, each die 320a, 321a in FIG. 3A includes trenches 323a, 322a formed in only one orientation. The mechanical stress on the overall wafer is thereby reduced by, as shown in FIG. 3A, placing dies 320a, 321a having trenches 323a, 322a oriented in different directions adjacent to one another. Although the length of each of the trenches 322a is greater than the length of each of the trenches 323a, the number of trenches 323a is greater than the number of trenches 322a. As a result, the overall area covered by the trenches 322a and 323a are about the same. Particularly in FIG. 3A, a wafer would include a pattern of dies 320a, 321a wherein every other die 320a, 321a in both horizontal and vertical directions on the wafer would include identical trench orientations.

Figure 3B:
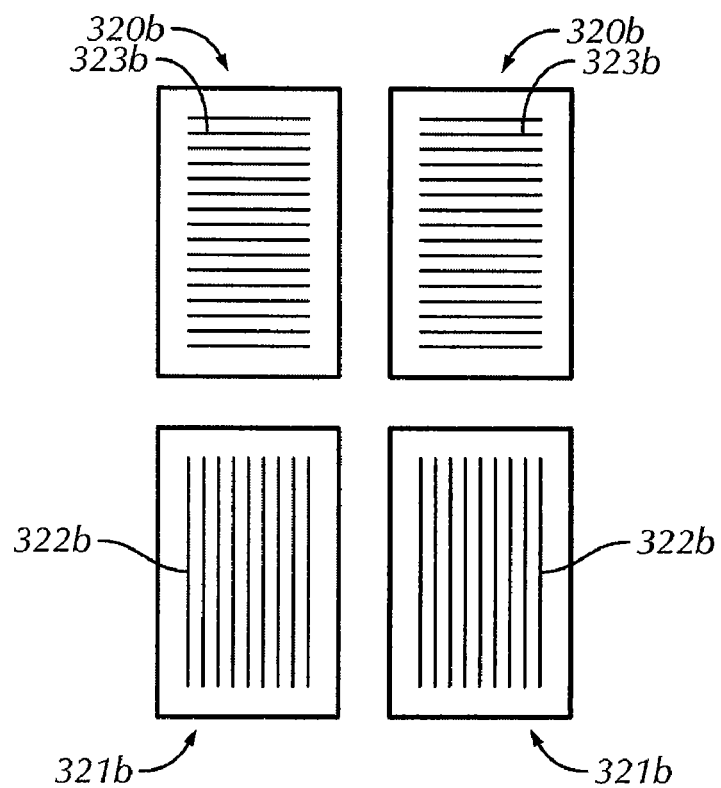

FIG. 3B depicts a configuration of the dies 320b, 321b as an alternative to that shown in FIG. 3A. Extrapolating the configuration of FIG. 3B over an entire wafer would result in a row (or column) of dies 320b having horizontally oriented trenches 323b, a row (or column) of dies 321b having vertically oriented trenches 322b, and so forth.

It is understood by those skilled in the art that orientations of the trenches 322, 323 in each die 320, 321 are not limited to the embodiments described above. The dies 320, 321 are also not limited to being rectangular in shape and may be designed in any manner convenient for use in superjunction devices, for example, square, rectangular, circular, polygonal, or the like.

Embodiments of the present invention may be employed not only in superjunction metal-oxide-semiconductor field-effect-transistor (MOSFET) devices, but also in Schottky devices or any devices that require deep, refilled trenches, including microelectromechanical systems (MEMS).

Embodiments of the present invention, such as those shown in FIGS. 2A-2C and 3A-3B, allow for the manufacture of larger diameter semiconductor wafers having a bow of less than 100 microns. Preferably, the wafer bow is reduced to below 50 microns on, for example, an eight inch diameter wafer.

Figure 4A:
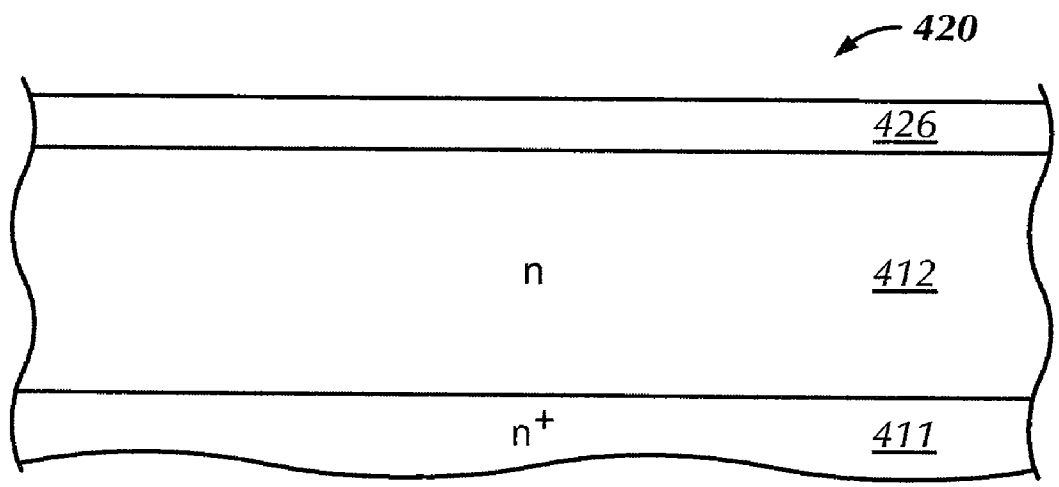
FIG. 4A is an enlarged cross-sectional elevational view of a portion of a die after an oxide layer is disposed on a silicon layer in accordance with a preferred embodiment.
Figure 4B:
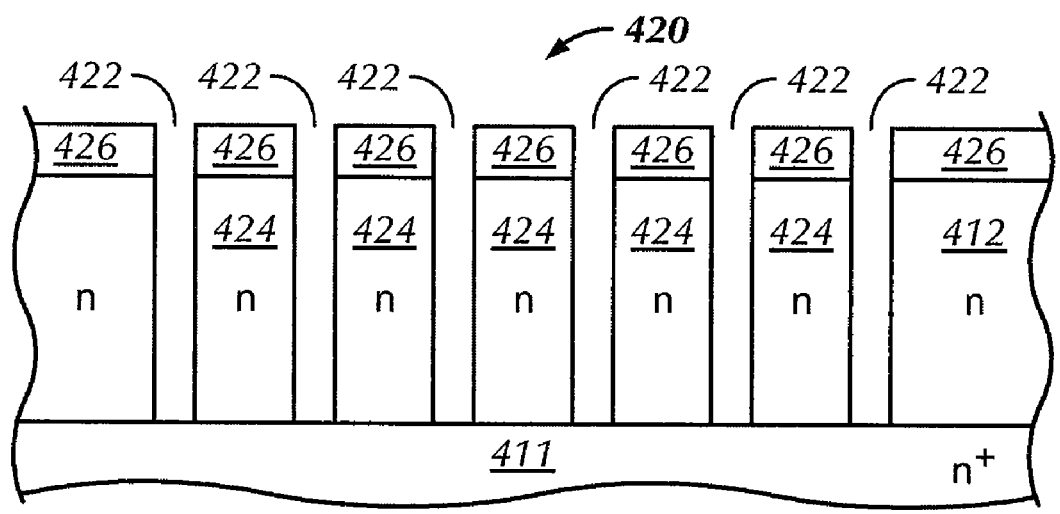
FIG. 4B is an enlarged cross-sectional elevational view of a portion of the die of FIG. 4A after trenches are formed thereon in accordance with a preferred embodiment.
Figure 4C:
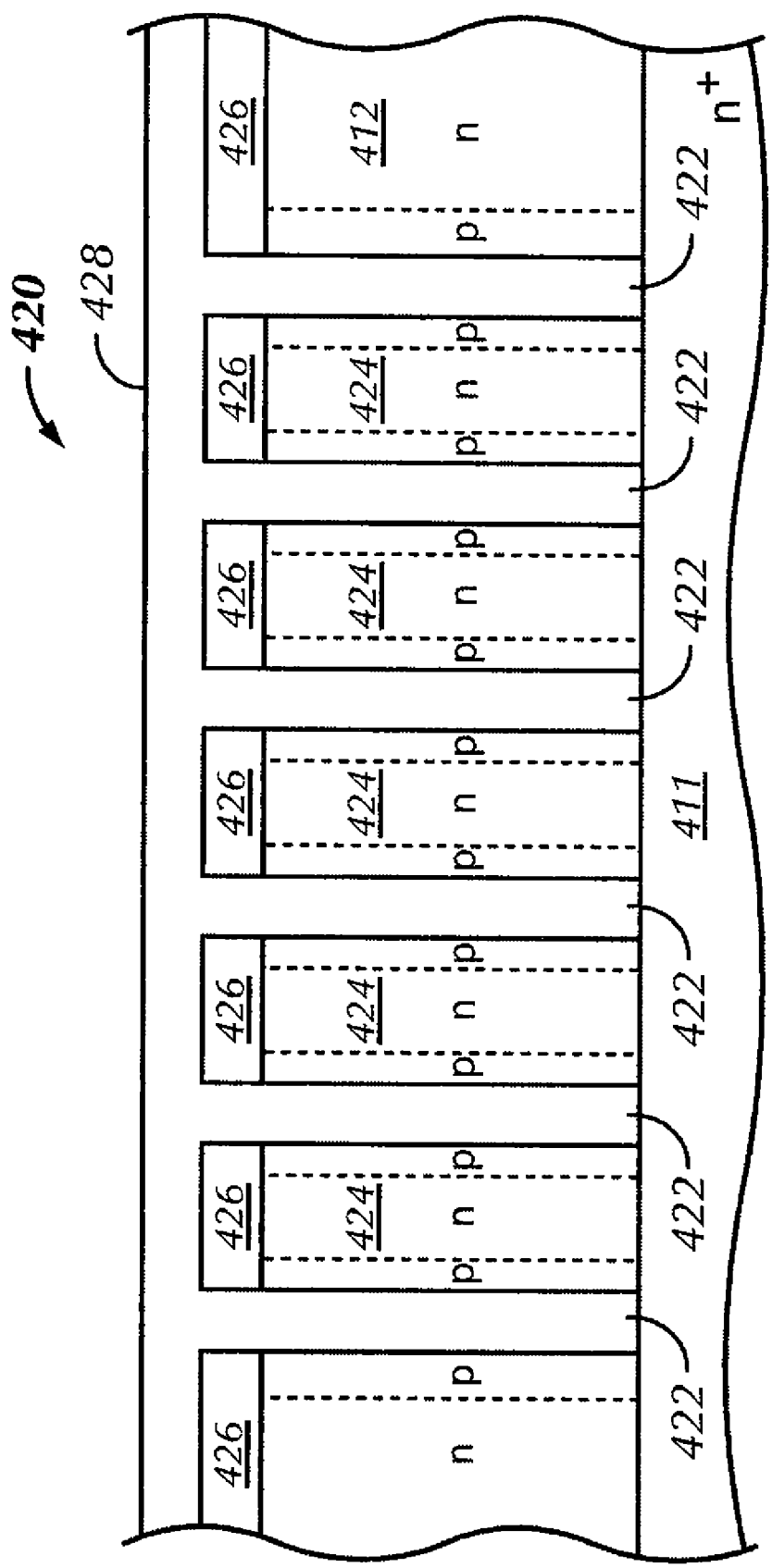
FIG. 4C is an enlarged cross-sectional elevational view of a portion of the die of FIG. 4B after the trenches are filled with a refill material in accordance with a preferred embodiment.

Referring to FIGS. 4A-4C, a process for manufacturing a superjunction device in accordance with embodiments of the present invention is described. FIG. 4A shows a partial cross-sectional elevational view of a die 420 as part of a wafer (not shown). The die 420 includes a semiconductor material layer 412 that may be doped as necessary. Preferably, the semiconductor material layer 412 is silicon. But, the semiconductor material layer 412 may be formed of other materials such as silicon carbide, gallium arsenide, germanium, or the like. In the example of FIGS. 4A-4C, the semiconductor material layer 412 is an n-type epitaxial silicon layer that is disposed on a heavily doped substrate layer 411. Although both layers 411, 412 are shown in FIG. 4A as having n-type conductivity, it is understood that one or both layers 411, 412 may instead have p-type conductivity. Other layers not shown may be included in the die 420 as required. A temporary layer used to handle the overall wafer may also be included.

An oxide or other dielectric layer 426 is disposed above the silicon layer 412. The oxide layer 426 is applied using one of thermal growth, low pressure (LP) chemical vapor deposition (CVD), plasma enhanced chemical vapor deposition (PECVD), atmospheric pressure chemical vapor deposition (APCVD), and deposition or some other process. The oxide layer 426 is preferably formed of an oxide. Alternatively, the oxide layer 426 may be a nitride, silicon-oxynitride, or other known dielectrics.

Known processing techniques such as grinding, polishing and etching may be performed to obtain a desired thicknesses of the substrate 411, silicon layer 412, oxide layer 426, and any additional layers. Generally, semiconductor wafers are coarsely thinned by a grinding machine having a rough grinding wheel or grinding pad such as a diamond or carbide wheel or pad having for example, diamond impregnated resin teeth. Grinding the wafer also allows for thinner, and therefore, smaller IC packages. Generally, polishing is a finer process using a wet silica-particle slurry which is washed across the surface of the wafer at a predetermined flow rate and is referred to as chemical mechanical polishing (CMP). Optionally, surfaces of the wafer are thinned by grinding and then polishing.

Referring to FIG. 4B, trenches 422 are formed in the die 420 through the oxide layer 426 and at least partially through the silicon layer 412, forming mesas 424. In the example of FIG. 4B the trenches 422 extend completely through the silicon layer 412 to the substrate 411, but the trenches 422 may extend to any desired depth. A photoresist patterning layer (not shown) may be disposed above the oxide layer 426 to provide a pattern for etching the trenches 422. Preferably, the trenches 422 are formed by utilizing known techniques such as plasma etching, reactive ion etching (RIE), sputter etching, vapor phase etching, chemical etching, deep RIE, or the like. Deep RIE technology permits deeper trenches 422 with straighter sidewalls. Furthermore, forming deeper trenches 422 that have straighter sidewalls than conventionally etched or formed trenches, in addition to other steps in the process, results in a final superjunction device with enhanced avalanche breakdown voltage ($V_b$) characteristics as compared to conventional semiconductor-transistor devices.

The sidewalls of each trench 422 can be smoothed, if needed, using, for example, one or more of the following process steps: (i) an isotropic plasma etch may be used to remove a thin layer of silicon (typically 100-1000 Angstroms) from the trench 422 surfaces or (ii) a sacrificial silicon dioxide layer may be grown on the surfaces of the trench 422 and then removed using an etch such as a buffered oxide etch or a diluted hydrofluoric (HF) acid etch. The use of the smoothing techniques can produce smooth trench 422 surfaces with rounded corners while removing residual stress and unwanted contaminates. However, where it is desirable to have vertical sidewalls and square corners, an anisotropic etch process may be used instead of the isotropic etch process discussed above. Anisotropic etching, in contrast to isotropic etching, generally means different etch rates in different directions in the material being etched.

The trenches 422 shown in FIG. 4B are formed in accordance with embodiments of the present invention described above. That is, sets of trenches 422 are formed having differing orientations on an individual die 420, or alternatively, trenches 422 formed on one die 420 have a different orientation than trenches 422 formed on an adjacent die 420.

The sidewalls of the trenches 422 are subsequently implanted or doped with a p-dopant such as boron (P) using any techniques known in the art. However, in some cases n-type doping may be required for the mesas 424 prior to the p-type doping of the trench 422 sidewalls. Preferably, the implants are performed without benefits of a masking step, e.g., at an implantation angle Φ (not shown) determined by the width and the depth of the trenches 422, at a high energy level in the range of about 40 Kilo-electron-volts (KeV) to several Mega-eV. Preferably, the energy level is in the range of about 200 KeV to 1 MeV, but it should be recognized that the energy level should be selected to sufficiently implant the dopant. The use of the predetermined implantation angle Φ ensures that only the sidewalls and not the bottoms of the trenches 422 are implanted.

In the manufacture of prior art devices, the implantation angle Φ is typically between 2° and 12°. The wafer is also oriented at one, or often two "twist angles," i.e., the relative orientation of the wafer in a plane defined by the wafer with respect to the ion beam. The most common angles are 0° and 180°. In accordance with preferred embodiments however, more twist angles may be required, for example, the wafer may be oriented at 45°, 135°, 225°, and 315° during processing. The twist angles required for ion implantation are often governed by restrictions imposed by the manufacturing apparatus. Therefore, embodiments of the present invention are in no way limited to the values or number of twist angles described above.

Following implanting the p-type implant on the sidewalls of the trenches 422, a drive-in step (i.e., a diffusion) is performed using any known techniques to create p-type doped regions (see FIG. 4C) proximate the sidewalls of the trenches 422. Preferably, a temperature and a time period for the drive-in step are selected to sufficiently drive in the implanted dopant into the mesas 424. For example, for p-type doping, the drive-in step (i.e., a diffusion) may be performed at a temperature of about 1150-1200° Celsius for about 1-2 hours. Alternatively, for n-type doping, the drive in step may be performed at a temperature of up to about 1200° C. for up to about 24 hours.

An optional oxidation step, usually performed in a steam or oxygen ambient, can also be performed with or subsequent to the drive-in step, which forms a silicon dioxide layer (not shown) on the sidewalls and the bottoms of the trenches 422. A thin layer of silicon nitride (not shown) can also be deposited on the sidewalls and the bottoms of the trenches 422. Deposition of silicon nitride on thermally oxidized silicon wafers does not influence the fundamental properties of the Si-SiO$_2$ interface. The existence of silicon nitride makes surface potential stable or unstable according to the structures, partly due to the existence of hydrogen in silicon nitride.

Hydrogen can influence electric properties. The layer of silicon nitride also serves the function to isolate and protect the silicon and silicon oxide from a refill material to be deposited in trenches 422.

The lining of the trenches 422 with silicon nitride can be performed in general by CVD (thermal or plasma). The lining of the trenches 422 with silicon dioxide can be performed in general by CVD (thermal, plasma, or spun-on-glass (SOG)). The lining of the trenches 422 with silicon dioxide and/or silicon nitride can preferably be performed using application of tetraethylorthosilicate (TEOS) because of the better conformity achieved by TEOS. Preferably, the silicon nitride is about 100 Å to about 10,000 Å thick (1 µm=10,000 Å).

Referring to FIG. 4C, the trenches 422 are then filled with a temporary or permanent refill material 428 such as a semi-insulating material, an insulating material, or a combination thereof. The refill material 428 can be a polysilicon, a re-crystalized polysilicon, a single crystal silicon, or a semi-insulating polycrystalline silicon (SIPOS). The trenches 422 may be filled using a SOG technique, CVD, surface reflow, or other methods known in the art. For example, the trenches 422 can be refilled with SIPOS. The amount of oxygen content in the SIPOS is selectively chosen to be between 2% and 80% to improve the electrical characteristics in the die 420. Increasing the amount of oxygen content is desirable for electrical characteristics, but varying the oxygen content also results in altered material properties. Higher oxygen content SIPOS will thermally expand and contract differently than the surrounding silicon which may lead to undesirable fracturing or cracking especially near the interface of differing materials. Accordingly, the oxygen content of the SIPOS is optimally selected to achieve the most desirable electrical characteristics without an undesirable impact on mechanical properties.

It will be appreciated by those skilled in the art that changes could be made to the embodiments described above without departing from the broad inventive concept thereof. It is understood, therefore, that the invention is not limited to the particular embodiments disclosed, but it is intended to cover modifications within the spirit and scope of the present invention as defined by the appended claims.

We claim:

1. A method of manufacturing a superjunction device, the method comprising:
    (a) providing a semiconductor wafer, the semiconductor wafer including at least one die;
    (b) forming at least one first trench in the at least one die, the at least one first trench having a first orientation and defining a first area; and
    (c) forming at least one second trench in the at least one die, the at least one second trench having a second orientation that is different from the first orientation, the at least one second trench defining a second area such that a ratio of the first area to the second area is about one-to-one.

2. The method of claim 1, further comprising:
    (d) forming at least one additional trench in the at least one die, each additional trench having an orientation that is different from at least one of the first orientation and the second orientation.

3. The method of claim 1, wherein the steps (a)-(c) are performed sequentially.

4. The method of claim 1, wherein the steps (b) and (c) are performed concurrently.

5. The method of claim 1, wherein prior to commencement of each of the steps (a)-(c), the respective preceding step is substantially completed.

6. The method of claim 1, wherein prior to commencement of each of the steps (a)-(c), the respective preceding step is fully completed.

7. A superjunction device formed by the method of claim 1.

8. A method of manufacturing a superjunction device, the method comprising:
    (a) providing a semiconductor wafer, the semiconductor wafer including at least one die;
    (b) forming a first plurality of trenches in the at least one die, each of the first plurality of trenches having a first orientation, the first plurality of trenches defining a first area; and
    (c) forming a second plurality of trenches in the at least one die, each of the second plurality of trenches having a second orientation that is different from the first orientation, the second plurality of trenches defining a second area such that a ratio of the first area to the second area is about one-to-one.

9. The method of claim 8, wherein
    (i) each of the first plurality of trenches has a length dimension, the length dimension of each of the first plurality of trenches being different from at least one other of the first plurality of trenches; and
    (ii) each of the second plurality of trenches has a length dimension, the length dimension of each of the second plurality of trenches being different from at least one other of the second plurality of trenches.

10. The method of claim 8, wherein
    (i) each of the first plurality of trenches has a length dimension, the length dimension of each of the first plurality of trenches being identical; and
    (ii) each of the second plurality of trenches has a length dimension, the length dimension of each of the second plurality of trenches being identical.

11. The method of claim 8, wherein the steps (a)-(c) are performed sequentially.

12. The method of claim 8, wherein the steps (b) and (c) are performed concurrently.

13. The method of claim 8, wherein prior to commencement of each of the steps (a)-(c), the respective preceding step is substantially completed.

14. The method of claim 8, wherein prior to commencement of each of the steps (a)-(c), the respective preceding step is fully completed.

15. A superjunction device formed by the method of claim 8.

* * * * *